United States Patent
Roizin et al.

(10) Patent No.: US 9,514,818 B1
(45) Date of Patent: Dec. 6, 2016

(54) MEMRISTOR USING PARALLEL ASYMMETRICAL TRANSISTORS HAVING SHARED FLOATING GATE AND DIODE

(71) Applicant: Tower Semiconductor Ltd., Migdal Haemek (IL)

(72) Inventors: Yakov Roizin, Afula (IL); Evgeny Pikhay, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 15/146,742

(22) Filed: May 4, 2016

(51) Int. Cl.
G11C 13/00 (2006.01)
G11C 16/04 (2006.01)
(Continued)

(52) U.S. Cl.
CPC .......... G11C 16/0441 (2013.01); G11C 11/54 (2013.01); G11C 16/10 (2013.01); G11C 16/14 (2013.01); G11C 16/26 (2013.01); H01L 27/0629 (2013.01); H01L 27/11521 (2013.01);
(Continued)

(58) Field of Classification Search
CPC ... G11C 16/0441; G11C 16/10; G11C 16/14; G11C 16/26; G11C 11/54; G11C 29/0642; G11C 13/0002; G11C 13/0004; G11C 13/0009; G11C 13/0069; H01L 27/0629; H01L 27/11521; H01L 29/872; H01L 29/4916; H01L 29/0847; H01L 29/47; H01L 29/7835; H01L 29/788; H01L 29/0642
USPC ............ 365/185.29, 63, 72, 148, 158, 163; 257/2
See application file for complete search history.

(56) References Cited

U.S. PATENT DOCUMENTS 5,825,063 A 10/1998 Diorio et al.
6,862,216 B1 * 3/2005 Hopper .............. G11C 16/0416
257/E29.302
(Continued)

FOREIGN PATENT DOCUMENTS

WO 2013178730 12/2013

OTHER PUBLICATIONS

DURFEE—IEEE "Comparison of floating gate neural network memory cells in standard VLSI CMOS technology" 1992 pp. 347-353.
(Continued)

Primary Examiner — Tan T. Nguyen
(74) Attorney, Agent, or Firm — Bever, Hoffman & Harms, LLP

(57) ABSTRACT

A two-terminal, single-poly floating gate memristor includes parallel-connected, asymmetrical readout and injection transistors having a shared floating gate structure, and a diode connected to drain terminals of the asymmetrical transistors. The injection transistor is configured with relatively high source/drain-to-gate capacitances to facilitate EEPROM-type (floating gate) program/erase operations (e.g., hot carrier injection and band-to-band tunneling of holes), and the readout transistor is configured (e.g., using a threshold voltage implant) to facilitate low-voltage readout operations. The diode is configured to function both as a limiting resistor that prevents over-erase during high-voltage erase operations, and also to prevent sneak (leakage) currents during low-voltage readout operations. The diode is implemented using either p-n junction or Schottky diode configurations formed on bulk silicon, or a lateral diode configurations disclosed for SOI substrates. A memory circuit including multiple two-terminal memristors disposed in a cross-point array is disclosed, which can be utilized, e.g., in a neuromorphic circuit.

20 Claims, 8 Drawing Sheets

(51) Int. Cl.
*H01L 27/115* (2006.01)
*H01L 29/49* (2006.01)
*H01L 29/788* (2006.01)
*H01L 27/06* (2006.01)
*H01L 29/872* (2006.01)
*H01L 29/861* (2006.01)
*H01L 29/78* (2006.01)
*H01L 29/08* (2006.01)
*H01L 29/47* (2006.01)
*H01L 29/06* (2006.01)
*G11C 16/10* (2006.01)
*G11C 16/14* (2006.01)
*G11C 16/26* (2006.01)
*G11C 11/54* (2006.01)

(52) U.S. Cl.
CPC ....... *H01L 29/0642* (2013.01); *H01L 29/0847* (2013.01); *H01L 29/47* (2013.01); *H01L 29/4916* (2013.01); *H01L 29/788* (2013.01); *H01L 29/7835* (2013.01); *H01L 29/861* (2013.01); *H01L 29/872* (2013.01); *G11C 13/0002* (2013.01)

(56) References Cited

U.S. PATENT DOCUMENTS

| | | | |
|---|---|---|---|
| 7,754,564 B2 | 7/2010 | Fenigstein et al. | |
| 7,800,156 B2 | 9/2010 | Roizin et al. | |
| 7,859,043 B2 | 12/2010 | Pikhay et al. | |
| 7,948,020 B2 | 5/2011 | Roizin et al. | |
| 8,344,440 B2 | 1/2013 | Pikhay et al. | |
| 8,344,468 B2 | 1/2013 | Roizin et al. | |
| 8,450,711 B2 * | 5/2013 | Williams | G11C 13/0007 257/2 |
| 8,455,852 B2 * | 6/2013 | Quitoriano | B82Y 10/00 257/2 |
| 8,737,113 B2 * | 5/2014 | Yang | G11C 13/0002 365/148 |
| 8,891,284 B2 * | 11/2014 | Williams | G11C 13/0007 257/2 |
| 8,999,785 B2 | 4/2015 | Edrei et al. | |
| 9,009,411 B2 * | 4/2015 | Moyer | G06F 12/0895 711/118 |

OTHER PUBLICATIONS

DIORIO—IEEE "A Single-Transistor Silicon Synapse" vol. 43, No. 11, 1996.

* cited by examiner

MEMRISTOR USING PARALLEL ASYMMETRICAL TRANSISTORS HAVING SHARED FLOATING GATE AND DIODE

FIELD OF THE INVENTION

This invention relates to memristors, and more particularly to two-terminal floating gate-type memristors that utilize low-voltage readout operations and can be fabricated using low-cost single-poly fabrication flows.

BACKGROUND OF THE INVENTION

A memristor is an electrical component utilized to store data in a manner similar to that of an electrically erasable programmable read-only memory (EEPROM) cell, but differs from standard reprogrammable non-volatile memory cells in that a memristor utilizes only two terminals. That is, standard EEPROM cells typically utilize three (i.e., source, drain and control/select) terminals to implement reprogrammable memory operations. In contrast, memristors are required to perform both program/erase operations and readout operations using only two terminals. Typically, a memristor's electrical resistance is caused to increase by passing a program/erase current through the memristor in one direction, and caused to decrease by passing the program/erase current in the opposite direction. Once the memristor's resistance state is programmed (set) in this manner, the stored data (i.e., the programmed increased or decreased resistance state) remains non-volatilely fixed (stored) until it is overwritten (changed) by a subsequently applied program/erase current. Also similar to an EEPROM, the stored data bit can be determined during a readout operation by applying a read voltage across the memristor and measuring a read current passed through the memristor, where the amount of read current passing through the memristor is determined by the programmed resistance state. According to Leon Chua, the inventor of memristors, all two-terminal non-volatile memory devices based on resistance switching are memristors, regardless of the device material and physical operating mechanisms.

In the early synapses-related modeling, attempts were made to emulate memristor-type performance using floating gate technology, where EEPROM-type memory devices (cells) were connected in cross-point arrays to implement neuro-inspired circuits that model learning processes in biological systems. As used herein, the phrase "floating gate technology" refers to integrated circuit fabrication techniques utilized, for example, to produce EEPROMs and other floating gate MOSFET (FGMOS) field-effect transistors. Such floating gate transistors are similar to conventional MOSFETs, but drain-to-source currents are controlled by a gate structure made up of an electrically isolated (i.e., completely surrounded by oxide or other highly resistive material) block of doped polycrystalline silicon (polysilicon, or simply "poly") capable of storing an applied charge for long periods of time. Floating gate technology employs the various programming mechanisms (e.g., Fowler-Nordheim tunneling and hot carrier injection) and associated circuit features to adjust (i.e., program or erase) the charge stored on floating gates.

Most attempts to implement synapses-related modeling based on floating gate technology utilize three-terminal EEPROM-type devices. Note that, although these floating gate devices were able to simulate memristor behavior, and were therefore sometimes referred to as "memristors", they are technically not memristors due to their three (not two) terminals. Moreover, attempts to utilize three-terminal floating gate devices were deemed overly complicated due to the need to control the third terminal (i.e., the control gate in non-volatile memory (NVM) terminology), which made the synapses-related modeling circuit schematically difficult and costly. Such three-terminal devices were used by Bernard Widrow and Ted Hoffin in the first neuromorphic simulators named Adaline and Madaline. Examples of such devices can be found in IEEE Transactions on Neural Networks, 1992; 3(3), pp. 347-53, "Comparison of floating gate neural network memory cells in standard VLSI CMOS technology" by Durfee D. A, et al.

Some three-terminal EEPROM-type devices utilized in neural networks were fabricated using double-poly CMOS processes. FIG. 10 depicts a representative device of this type, and is similar to that disclosed in "A Single-Transistor Silicon Synapse", Chris Diorio et al., (IEEE Transactions ED, vol. 43, No. 11, 1996). The disclosed device includes source and drain terminals, a third (control gate) terminal implemented using a second polysilicon (POLY2) structure disposed over the floating gate, which is implemented using a first polysilicon (POLY1) structure. These devices are programmed by channel hot electrons and erased by Fowler-Nordheim tunneling generated at the locations indicated in FIG. 10. The authors of the above-mentioned paper disclosed a two-dimensional synaptic array in which each three-terminal EEPROM-type device of FIG. 10 formed one synapse of the array. In addition to the devices not being memristors (i.e., because they have three terminals), and in addition to their fabrication using a complicated double-poly fabrication technology, the three-terminal EEPROM-type device of FIG. 10 encountered array limitations in that row synapses shared a common drain line, so tunneling at one synapse caused undesired tunneling and hot carrier injection at other row synapses.

FIG. 11 shows an exemplary two-terminal EEPROM-type floating gate cell similar to those disclosed, for example, in "EEPROM MEMORY CELL AS A MEMRISTIVE COMPONENT" by Herman Kohlstedt et al., (Universitat Zu Kiel); International Application No. WO2013178730 (also published as German Application No. DE102012209336). The disclosed two-terminal device utilizes a floating gate FG, and is configured as a memristor by way of connecting a control gate CG to the drain terminal D. The floating gate FG allows the respective channel resistance value taken last to be preserved even when no more external voltage is applied at the terminal connections C1 and C2.

FIG. 12 is a simplified diagram depicting two-terminal memristor elements disposed in a cross-point array configuration similar to that utilized in two-dimensional synaptic arrays for synapses-related modeling. The two-terminal memristor elements ME (indicated by rectangles) have drain terminals respectively connected to an associated bit (row) lines BL1 to BL3, and source terminals respectively connected to an associated word (column) lines WL1 to WL3.

Based on practical experience, the present inventors understand that cross-point arrays generated using conventional two-terminal EEPROM-type devices (e.g., see FIG. 11) encounter over-erase problems during erase operations and require the use of high-voltage readout operations, where both of these problems lead to read disturb issues that prevent reliable synapses-related modeling.

Referring to FIG. 12, over-erase is caused by way directly connecting the drain terminals of the memristor elements ME to associated shared bit lines BL1 to BL3 during erase operations, and results in a reduction of the Vt of the over-erased memristor element below 0.5V. During a typical programming operation, the drain electrode/terminal of a target element (e.g., element TME) is directly connected to a high programming voltage source by way of its associated bit line (e.g., bit line BL2), and during erase operations the element's source terminal is connected to a high voltage by way of its associated word line (e.g., a high voltage on word line WL2 is applied to the source terminal of target element TME). Unless the drain terminal of target element TME is isolated during the erase operation, an uncontrollable erase mode may occur that can result in an over-erase condition, which can lead to degradation or even complete failure of the device. That is, the uncontrollable erase mode occurs when the element's floating gate reaches a fully erased state during an erase operation, and channel electrons generate secondary holes that enter the floating gate, producing an undesirable further reduction of the stored charge that produces a threshold voltage below desirable levels (e.g., below 0.5V). This uncontrollable erase mode cannot be prevented unless the drain electrode is disconnected or otherwise isolated during the erase operation. However, because the drain terminal is directly connected to an associated bit line in order to facilitate programming operations, and because a third terminal is not available to selectively isolate the drain terminal during erase operations, memristor elements ME are subject to over-erase. The present inventors encountered this over-erase problem when experimenting with EEPROM configurations similar to those of FIG. 11 (e.g., those disclosed in co-owned U.S. Pat. No. 7,800,156), and determined that over-erase caused the memory device's threshold voltage to be decreased below 0.5V.

High-voltage readout operations, typically of the order of 2V to 3V, are required by conventional two-terminal EEPROM-type devices (e.g., see FIG. 11) because there is no separate control gate (as in EEPROM memories) to avoid over-erase, so both program/erase and readout operations must be performed through the same two-terminal transistor structure. Because the transistor structure must be sufficiently robust to exclude sneak (leakage) currents in the array, the transistor structure's threshold voltage (e.g., when erased) is also relatively high (e.g., 1.5V to 2.5V), thereby requiring readout voltages in the range of 2V to 3V. These high readout voltages are generated across a target element (e.g., central memristor element TME in FIG. 12) by way of applying two signals (e.g., 3V and 0V) respectively to associated bit line BL2 and associated word line WL2, whereby a charge stored on target memristor element TME can be determined by measuring a resulting read current $I_{READ}$ generated on associated word line WL2. However, the low Vt can lead to sneak currents through other memristor elements, such memristor element OEME in FIG. 12, that can prevent accurate readout of a target memristor element. For example, as indicated in FIG. 12, during readout of target memristor TME, if neighboring memristor element OEME is over-erased, a sneak current $I_{SNEAK}$ can be generated through over-erased element OEME by way of (intermediate) elements IME1 and IME2 such that sneak current $I_{SNEAK}$ flows on bit line BL2, thereby preventing accurate readout of the programmed/erased state of target element TME by corrupting read current $I_{READ}$.

Neuromorphic engineering, also known as neuromorphic computing, is a concept developed by Carver Mead in the late 1980s, and involves the use of very-large-scale integration (VLSI) systems containing electronic analog circuits to mimic neuro-biological architectures present in the nervous system. In recent times the term neuromorphic has been used to describe analog, digital, and mixed-mode analog/digital VLSI circuits and software systems that implement models of neural systems (for perception, motor control, or multi-sensory integration). The implementation of neuromorphic computing has been implemented on the hardware level by neuromorphic circuits. A key aspect of neuromorphic engineering is understanding how the morphology of individual neurons, circuits, applications, and overall architectures creates desirable computations, affects how information is represented, influences robustness to damage, incorporates learning and development, adapts to local change (plasticity), and facilitates evolutionary change. Neuromorphic engineering is an interdisciplinary subject that takes inspiration from biology, physics, mathematics, computer science and electronic engineering to design artificial neural systems, such as vision systems, head-eye systems, auditory processors, and autonomous robots, whose physical architecture and design principles are based on those of biological nervous systems.

To date, most VLSI circuits developed for neuromorphic systems relied on floating gate memristors or arrays of three-terminal memristor-emulating cells, such as those described above, and were therefore subject to the limitations mentioned above. More recently, various new types of memristors have been introduced, including Phase-Change Memory (PCM), and Resistive Random-Access Memory (RRAM or ReRAM), all of which being referred to as memristive elements or memristors. Though allowing small cell footprints, these memristor technologies are still not fully mature. In particular, the arrays of interconnected resistive memory two-terminal devices require special additional rectifying elements in each of the memristor cells. Otherwise, such arrays exhibit sneak currents (i.e., stray currents due to leakage). Memory arrays using ReRAM memristors also have reliability (endurance and retention) limitations.

What is needed is a memristor suitable for neuromorphic simulations and other bio-inspired modeling systems that utilizes the benefits of floating gate technology while overcoming the above-mentioned problems associated with implementing conventional memristor devices in cross-point array configurations. What is particularly needed is a two-terminal, floating gate (EEPROM-type) memristor capable of implementing reliable floating gate program/erase operations while avoiding the over-erase problems associated with conventional approaches, and also capable of performing readout operations at voltages low enough to avoid the parasitic programming (read-disturb) problems associated with conventional approaches. What is preferably needed is a solution achieving the above that can also be implemented using low-cost standard single-poly semiconductor fabrication (e.g., CMOS) technology.

SUMMARY OF THE INVENTION

The present invention is directed to a two-terminal floating gate (EEPROM-type) memristor that utilizes two parallel-connected asymmetrical transistors and a diode to allow low threshold voltage operation and avoid over-erase and accompanying sneak current problems associated with conventional EEPROM-type memristor approaches. According to an aspect of the invention, a readout (first) transistor of the parallel asymmetrical transistors avoids read-disturb problems by way of being configured with a relatively long channel length. According to another aspect, an injection (second) transistor of the parallel asymmetrical transistors facilitates high-voltage EEPROM-type program/erase operations by way of being configured with a relatively short channel length and a relatively high drain-togate capacitance. According to a third aspect, the readout and injection transistors utilize a shared (integral, single-piece) floating gate structure that stores a charge transferred to/from the injection transistor during program/erase operations, whereby the stored charge controls current flow through the readout transistor during subsequent readout operations. In addition, the floating gate structure forms the only polycrystalline silicon structure of the memristor, which facilitates fabrication using low-cost single-poly fabrication flows. According to a fourth aspect, the diode is connected to the drain terminals of the parallel asymmetrical (readout and injection) transistors such that the diode functions both as a current limiter that prevents over-erase during the high-voltage erase operations, and also functions to prevent sneak (leakage) currents during low-voltage readout operations. By combining these features, the present invention provides a single-poly memristor that reliably overcomes the problems associated with implementing conventional two-terminal EEPROM-type devices in cross-point arrays by way of utilizing the readout transistor to perform low-voltage readout operations, by utilizing the injection transistor to facilitate reliable high-voltage program/erase operations, and by utilizing the diode to prevent both sneak currents during the low-voltage readout operations and over-erase conditions during the program/erase operations.

In an exemplary embodiment, each memristor is configured with the diode disposed between drain terminals of the readout and injection transistors, the source terminals of the readout and injection transistors conductive structure, and the shared floating gate implemented, for example, by a C-shaped polysilicon structure having associated poly portions forming the gate structures of the readout and injection transistors. According to alternative specific embodiments, the diode utilized by each memristor is implemented as a vertical p-n junction diode, a Schottky diode, or a lateral p-n or p-i-n diode, depending on desired fabrication cost and performance considerations. In one approach, bulk silicon CMOS processes are utilized to produce memristors having diodes implemented as p-n junction diodes or Schottky diodes formed in N-well regions that abut N+-doped drain regions of the readout and injection transistors. In p-n junction diode embodiments, the diode's anode is implemented by a P+ diffusion region formed in the N-well region (cathode) using established (standard) N− and P+ implants provided in the single-poly CMOS fabrication flow in order to minimize fabrication costs, but may be implemented by non-standard (special) implants to enhance diode performance. In Schottky diode embodiments, the p-type diffusion region utilized in the p-n junction approach is omitted, and the diode is formed either by a metal contact structure or a silicide structure disposed in direct contact with the upper substrate surface over the N-well region. In another approach, a lateral diodes are implemented by one or more doped regions disposed in an SOI substrate that abut or are otherwise coupled to the drain terminals of the readout and injection transistors. In one specific embodiment, the lateral diode includes a P+ doped region directly contacting (abutting) the N+ doped regions forming the drain terminals of the readout and injection transistors. In another specific embodiment, the lateral diode includes a central P+ doped region and at least one N-type doped region disposed between the central P+ doped region the N+ doped regions forming the drain terminals of the readout and injection transistors. In yet another specific embodiment, the lateral diode includes a central P+ doped region and at least one P− doped region disposed between the central P+ doped region and the N+ doped regions forming the drain terminals of the readout and injection transistors. Each of the various SOI lateral diode embodiments provides advantages in certain applications (e.g., if a higher erase voltage is needed, a diode type exhibiting higher breakdown voltage is utilized, and if fast programming is needed, a diode type exhibiting low forward resistance is utilized).

The present invention is also directed to a memory circuit and to a neuromorphic circuit including memristors disposed in a cross-point array (i.e., arranged in rows and columns), where each memristor is implemented using one of the novel memristor structures discussed above and connected between associated signal lines (e.g., between an associated word line and an associated bit line). As set forth above, the novel memristor configuration facilitates the fabrication of cross-point type arrays using low-cost single-poly CMOS fabrication techniques, providing memory circuits that are suitable for neuromorphic circuits. In addition, the single-poly structure of the novel memristors facilitates the fabrication of cross-point-array-type memory circuits using the same CMOS fabrication flow as that utilized to generate processors and other components of a neuromorphic circuit, thereby minimizing production costs. Further, memristors produced in accordance with the present invention are believed to be highly reproducible and repeatable, to exhibit high retention characteristics, and to require relatively simple circuitry for performing associated program, erase and readout operations, thereby making them ideal for use in neuromorphic other bio-inspired modeling systems.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in memristive elements (memristors). The following description is presented to enable one of ordinary skill in the art to make and use the invention as provided in the context of a particular application and its requirements. As used herein, directional terms such as "upper" are intended to provide relative positions for purposes of description, and are not intended to designate an absolute frame of reference. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
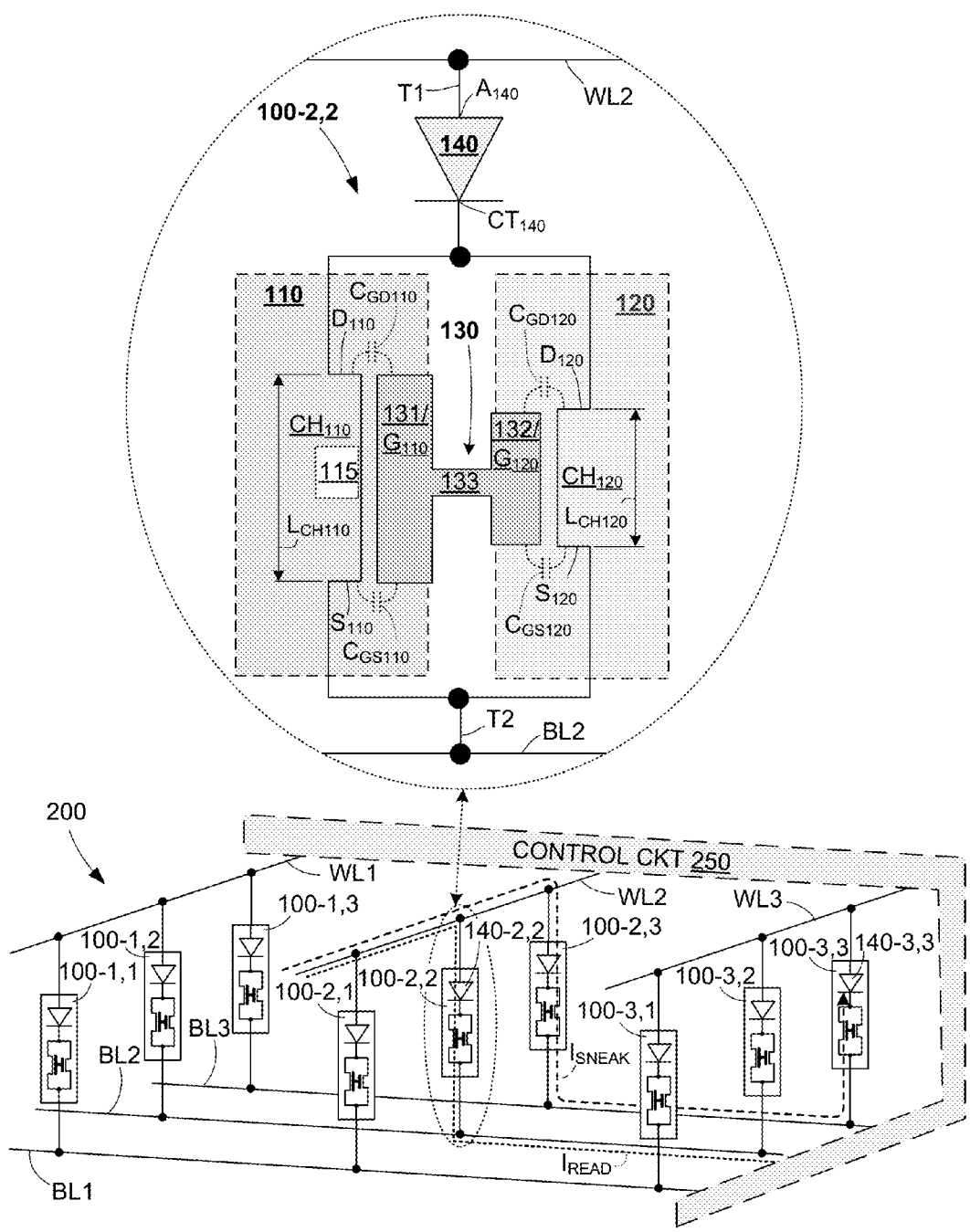
FIG. 1 is a simplified circuit diagram showing a memristor according to a generalized embodiment of the present invention.

FIG. 1 is a simplified diagram showing a cross-point array 200 including nine memristors 100-1,1 to 100-3,3 and a control circuit 250 according to a simplified embodiment of the present invention. Each memristor 100-1,1 to 100-3,3 includes structures identical to those of memristor 100-2,2, which is shown in additional detail in the bubble provided at the upper portion of FIG. 1 and described in additional detail below (i.e., all references to internal connections of memristor 100-2,2 below are understood as being applicable to all other memristors of array 200). Memristors 100-1,1 to 100-3,3 are arranged in row groups connected to associated word lines WL1 to WL3, and column groups connected to associated bit lines BL1 to BL3. For example, memristors 100-1,1 to 100-1,3 form a row group that is connected to word line WL1. Similarly, memristors 100-1,1, 100-2,1 and 100-3,1 form a column group that is connected to bit line BL1. Accordingly, each memristor 100-1,1 to 100-3,3 is individually addressable during program, erase and read operations by applying appropriate potentials to the unique word-line-bit-line combination associated with a targeted memristor. For example, as explained in detail below, memristor 100-2,2 is individually addressable during program, erase and readout operations by way of applying signals to word line WL2 and bit line BL2.

In compliance with the established convention, each memristor 100-1,1 to 100-3,3 is a two-terminal device that is controlled entirely by signals transmitted on bit lines BL1 to BL3 and word lines WL1 to WL3. That is, all program/erase and readout operations are performed solely by way of suitable potentials generated by a control circuit 250 onto bit lines BL1 to BL3 and word lines WL1 to WL3. For example, referring to the top of FIG. 1, all program/erase and readout operations of memristor 100-2,2 are performed solely by applying voltages by way of word line WL2 and bit line BL2, which are respectively connected to a (first) terminal T1 and a (second) terminal T2 of memristor 100-2,2.

According to an aspect of the invention, memristor 100-2,2 generally includes parallel-connected asymmetrical transistors 110 and 120 that share a single-piece floating gate 130, and a diode 140 connected between terminal T1 and drain regions $D_{110}$ and $D_{120}$ of transistors 110 and 120, with source regions $S_{110}$ and $S_{120}$ of transistors 110 and 120 connected to terminal T2. As set forth below, parallel-connected asymmetrical transistors 110 and 120 and diode 140 cooperatively function to overcome the problems associated with implementing conventional two-terminal EEPROM-type devices when connected in cross-point array 200.

Parallel asymmetrical transistors 110 and 120 of memristor 100-2,2 are respectively referred to herein as readout (first) transistor 110 and injection (program/erase or second) transistor 120. As these names imply, readout transistor 110 is configured to optimize readout operations, and injection transistor 120 is configured to optimize program/erase operations. As indicated in FIG. 1, readout transistor 110 includes drain region (terminal) $D_{110}$ and source region (terminal) $S_{110}$ separated by a channel region $CH_{110}$ having a channel length $L_{CH110}$, and readout transistor 110 includes drain region $D_{120}$ and source region $S_{120}$ separated by a channel region $CH_{120}$ having a channel length $L_{CH120}$. Readout transistor 110 and injection transistor 120 are parallel-connected by way of both drain regions $D_{110}$ and $D_{120}$ being connected to a cathode terminal $CT_{140}$ of diode 140, and by way of both source regions $S_{110}$ and $S_{120}$ being connected to terminal T2. Readout transistor 110 and injection transistor 120 have different threshold voltages (Vt), with the Vt of readout transistor being relatively low to facilitate low-voltage readout operations (i.e., by way of applying a readout voltage below 1 V across terminals T1 and T2), and the Vt of injection transistor 120 to facilitate performing high-voltage program/erase operations (i.e., by applying program/erase voltages above 5V across terminals T1 and T2). For example, in an exemplary embodiment, readout transistor 110 is configured with a relatively long channel length $L_{CH110}$ (e.g., 0.6 µm (microns)) and a low Vt of 0.3V that allow readout transistor 110 to perform low-voltage readout operations, and injection transistor 120 is configured with a relatively short channel length $L_{CH120}$ (e.g., 0.25 µm) and a relatively high Vt (e.g., 1.5V) that allow injection transistor 120 to perform high-voltage program/erase operations. Those skilled in the art will recognize these feature differences and values are merely exemplary, and that the spirit of the present invention may be achieved by implementing other feature differences.

As mentioned above, readout transistor 110 and injection transistor 120 share floating gate 130. In one embodiment floating gate 130 is an integral (single-pieced) polycrystalline silicon (polysilicon, or simply "poly") structure that is entirely surrounded by oxide or other highly resistive material (i.e., electrically isolated, or "floating"), and includes a (first) poly portion 131 configured to form a (first) gate terminal $G_{110}$ of readout transistor 110, a second poly portion 132 configured to form a (second) gate terminal $G_{120}$ of injection transistor 120, and an intervening (third) poly portion 133 connected between poly portions 131 and 132. First poly portion 131 is shaped and positioned such that a (first) source-to-gate capacitance $C_{GS110}$ and a (first) drainto-gate capacitance $C_{GD110}$ are generated between first poly portion 131 and source terminal $S_{110}$ and drain terminal $D_{110}$, respectively, of readout transistor 110. Similarly, second poly portion 132 is shaped and positioned such that a (second) source-to-gate capacitance $C_{GS120}$ and a (second) drain-to-gate capacitance $C_{GD120}$ are generated between second poly portion 132 and source/drain terminals $S_{120}$ and $D_{110}$, respectively, of injection transistor 120. Both transistors 110 and 120 have relatively high drain-to-gate capacitances $C_{GD120}$ and $C_{GD110}$ and relatively low of source-to-gate capacitances $C_{SD120}$ and $C_{SD110}$. That is, readout transistor 110 is asymmetrical in that (first) drain-to-gate capacitance $C_{GD110}$ generated between poly portion 131 and drain terminal $D_{110}$ is greater than a (first) drain-to-source capacitance $C_{GS110}$ generated between poly portion 131 and source terminal $S_{110}$. Similarly, injection transistor 120 is asymmetrical in that (second) drain-to-gate capacitance $C_{GD120}$ generated between poly portion 132 and second drain terminal $D_{120}$ is greater than (second) source-to-gate capacitance $C_{GS120}$ generated between poly portion 132 and source terminal $S_{120}$.

Figure 10:
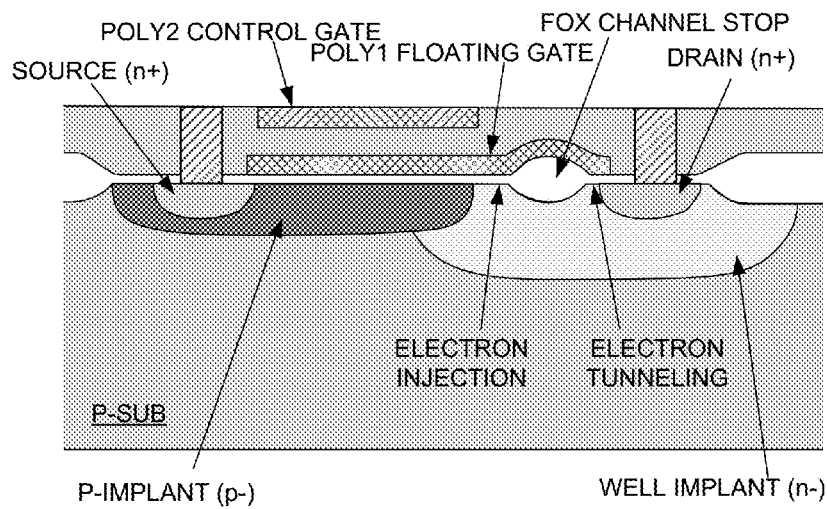
FIG. 10 is a cross-sectional side view showing a conventional three-terminal EEPROM-type device.
Figure 11:
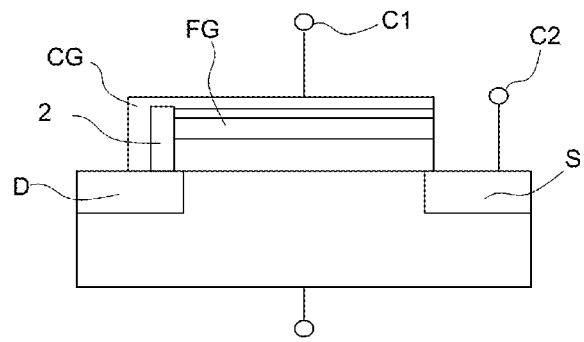
FIG. 11 is cross-sectional side view showing a conventional two-terminal EEPROM-type device.

According to an aspect of the invention, floating gate 130 forms the only polycrystalline silicon structure of memristor 100 (i.e., memristor does not include or utilize a control gate or any other dedicated polysilicon gate structure to perform program, erase and readout operations). This single-gate feature allows memristor 100 to be fabricated using low-cost single poly CMOS fabrication flows, thereby providing a significant cost advantage over conventional approaches formed by double-poly CMOS processes, such as the conventional device described above with reference to FIG. 10.

Diode 140 is configured and oriented to allow current flow in one direction through memristor 100-2,2 (i.e., from terminal T1 to terminal T2), and to impede current flow in the opposite direction through memristor 100-2,2 (i.e., from terminal T2 to terminal T1). As set forth below, diode 140 may be implemented using several different diode configurations, including a vertical p-n junction diode, a Schottky diode, or a lateral Silicon-On-Insulator (SOI) diode, provided the diode structure of each of these configurations is oriented as indicated in FIG. 1 (i.e., with the diode's anode terminal $A_{140}$ connected to terminal T1, and its cathode terminal $CT_{140}$ connected to drain regions $D_{110}$ and $D_{120}$). As explained in additional detail below, by preventing current flow from terminal T2 to terminal T1 through memristor 100-2,2, diode 140 serves the critical function of prevent over-erase of floating gate 130 during high-voltage erase operations, and also serves to prevent sneak (leakage) currents during low-voltage readout operations.

Various optional features and configurations may be utilized to further enhance the operations of memristors 100-1,1 to 100-3,3, thereby further optimizing memristors of the present invention for operation in cross-point array 200. For example, as indicated in FIG. 1, readout transistor 110 may be implemented as a native transistor by way of a threshold voltage (Vt) implant 115 disposed in channel region $CH_{110}$ using known techniques, where Vt implant 115 serves to reduce the threshold voltage of readout transistor 110 to a range of 0 to 0.5V. In other embodiments, a similar Vt implant may be used to implement readout transistor 110 as an enhancement mode transistor. Additional optional features and configurations are described below with reference to various specific embodiments.

Figure 1A:
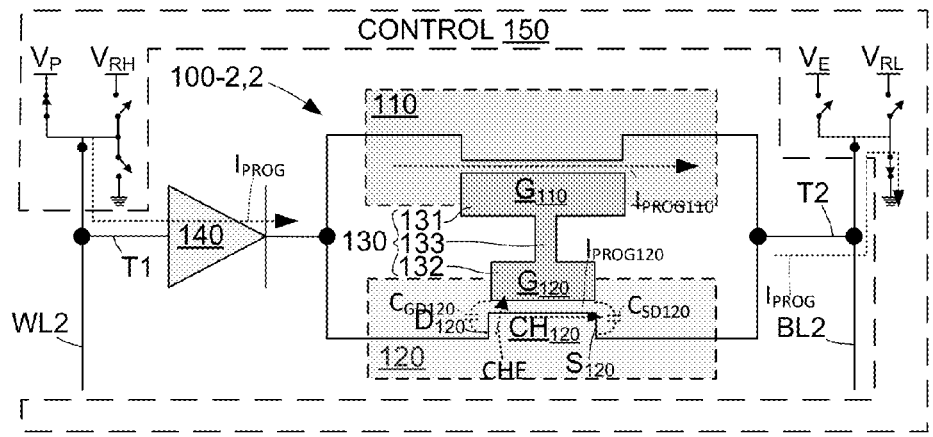
FIGS. 1(A), 1(B) and 1(C) are simplified circuit diagram showing the memristor of FIG. 1 during exemplary program, erase and readout operations, respectively.
Figure 1B:
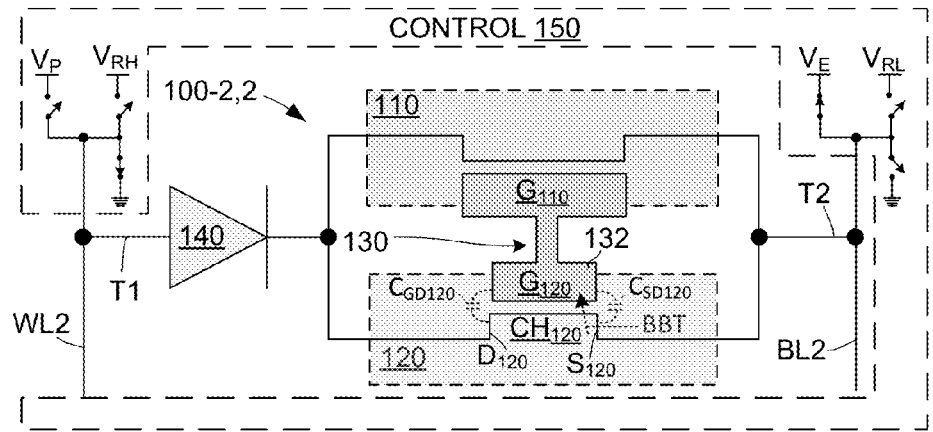
Figure 1C:
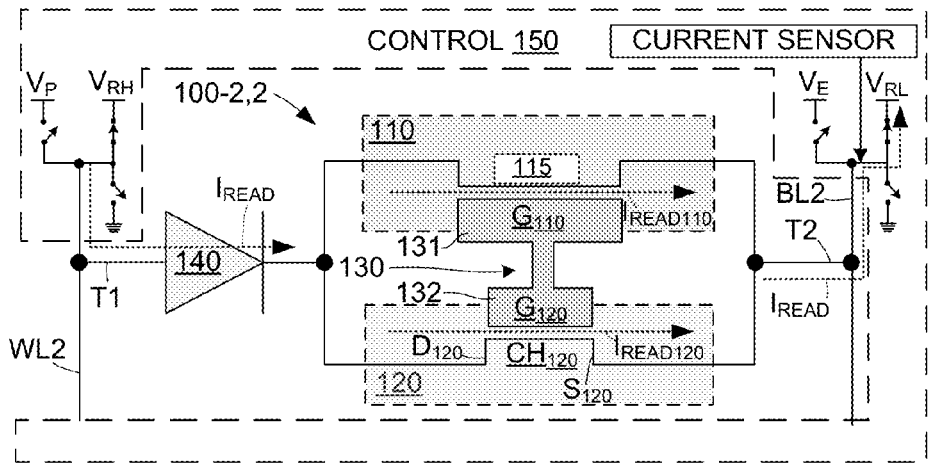
Figure 2A:
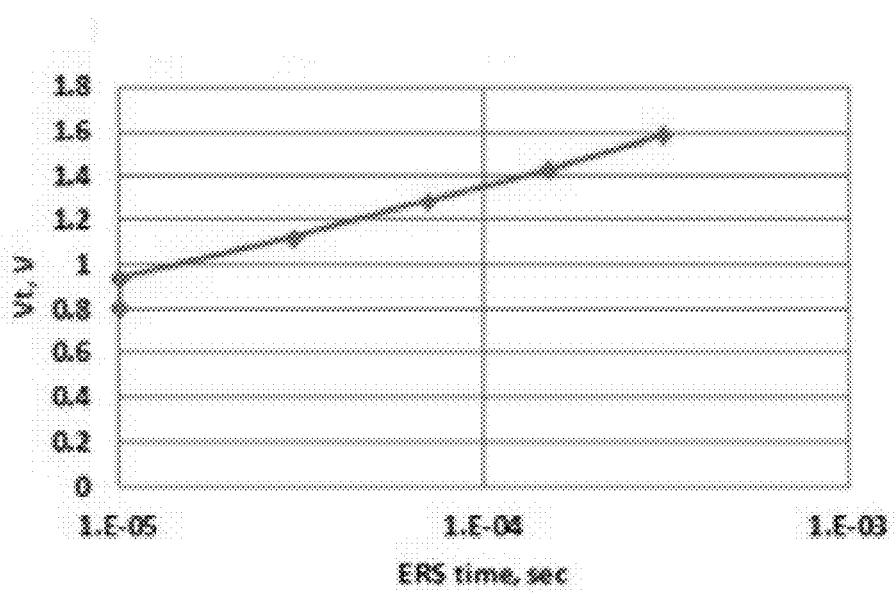
FIGS. 2(A) and 2(B) are diagrams showing exemplary program and erase characteristics of memristors produced in accordance with the present invention.
Figure 2B:
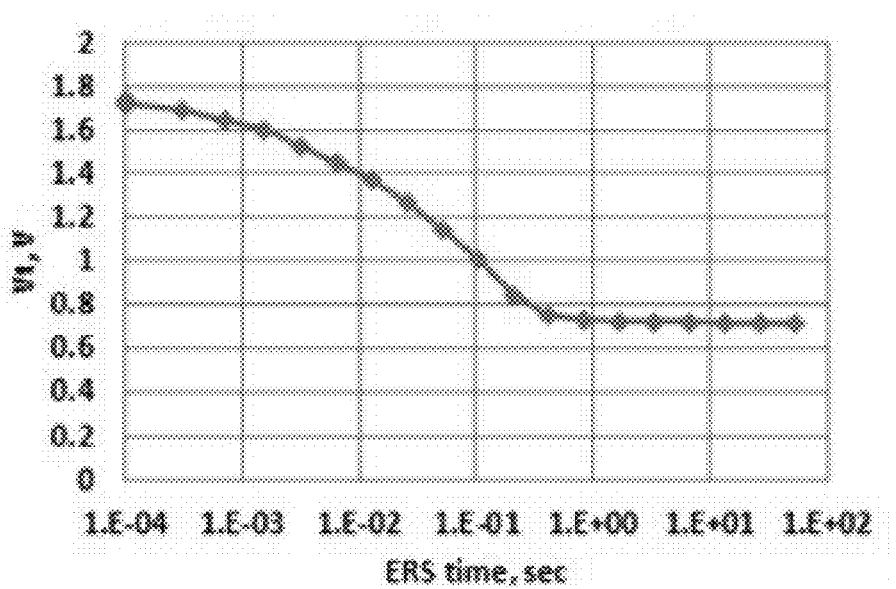

FIGS. 1(A) to 1(C) depict memristor 100-2,2 during exemplary program, erase and readout operations, respectively, and FIGS. 2(A) and 2(B) are graphs showing exemplary threshold voltage changes incurred by memristors generated in accordance with the present invention. For illustrative purposes, FIGS. 1(A) to 1(C) depict simplified switch connections associated with the operation control circuit 250. Those skilled in the art will recognize that the depicted switch connections can be implemented using various techniques, and that control circuit 250 includes additional circuitry not depicted in the simplified illustrative examples.

Referring to FIG. 1(A), control circuit 250 is configured to program memristor 100-2,2 during a program operation by way of coupling a positive program voltage $V_P$ (e.g., 5.5 Volts) to terminal T1 (by way of associated word line WL2) and to coupling terminal T2 to ground (by way of associated bit line BL2), thereby generating currents $I_{PROG110}$ and $I_{PROG120}$ through readout transistor 110 and injection transistor 120, respectively. These conditions generate a channel hot electron (CHE) injection mechanism in injection transistor 120, causing the injection of electrons from channel region $CH_{120}$ into floating gate 130 (i.e., by way of poly portion 132/gate region $G_{120}$ of injection transistor 120), whereby the resulting programmed charge stored on floating gate 130 increases the threshold voltage of memristor 100-2,2. FIG. 2(A) shows exemplary programming characteristics of a memristor generated in accordance with the present invention, and indicates a threshold voltage increase from 0.8V to 1.6V. In one embodiment, source region $S_{120}$ and drain region $D_{120}$ are enhanced to include an optional LV-LDD implant (e.g., arsenic (As) and boron difluoride ($BF_2$)) using known techniques in order to enhance CHE injection in order to reduce the required program operation time period. Note that current $I_{PROG110}$, which passes through readout transistor 110 and flows in parallel with injection transistor current $I_{PROG120}$ during the programming operation, does not interfere with the programming mechanism, though results in additional power consumption.

Referring to FIG. 1(B), control circuit 250 is further configured to erase a charge from memristor 100-2,2 during an erase operation by way of coupling a positive erase voltage $V_E$ (e.g., 5.5V to 8.5V) to terminal T2 while connecting terminal T1 to ground (0V). Under these conditions, holes are introduced from source region $S_{120}$ of injection transistor 120 to portion 132 (gate $G_{120}$) of floating gate 130 by way of a band-to-band tunneling (BBT) mechanism. As a result, as depicted in FIG. 2(B), the threshold voltage of memristor 100-2,2 decreases (e.g., from approximately 1.6V to approximately 0.7V). Referring again to FIG. 1(B), while memristor 100-2,2 is being erased, channel leakage between source region $S_{120}$ and drain region $D_{120}$ occurs when the threshold voltage becomes low. This channel leakage transfers the potential (e.g., 5.5V) applied to source region $S_{120}$ through channel region $CH_{120}$ to drain region $D_{120}$. Because the current from drain region $D_{120}$ to terminal T1 is prevented by diode 140, the potential on drain region $D_{120}$ continues to increase as floating gate 130 is erased, thereby creating a type of positive feedback that causes the erase process to automatically terminate when the potential of the floating gate is increased by coupling from drain $D_{120}$ region. In this way, diode 140 serves to prevent over-erase of floating gate 130 during erase operations.

Figure 12:
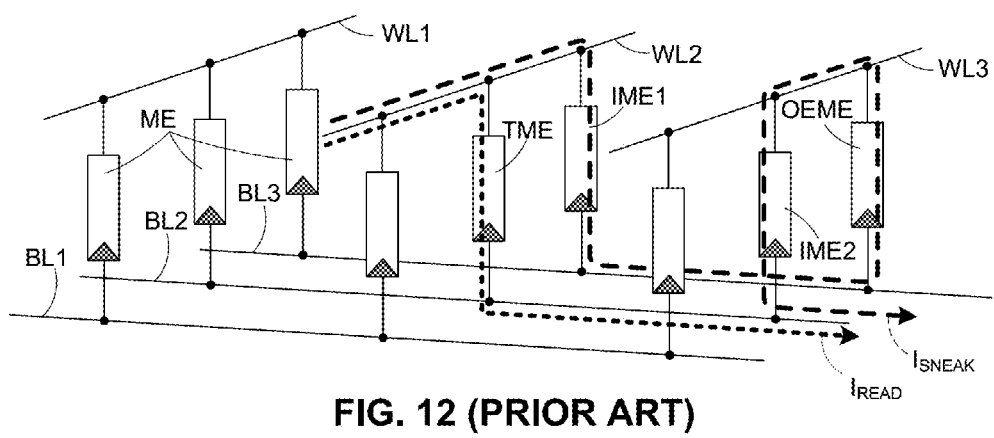
FIG. 12 is a simplified diagram depicting a plurality of conventional two-terminal devices connected in a cross-point array.

Referring to FIG. 1(C), control circuit 250 is further configured to read out a charge stored on memristor 100-2,2 during an erase operation by way of applying a higher (first) readout voltage $V_{RH}$ to terminal T1 and a lower (second) readout voltage $V_{RL}$ to terminal T2, and then measuring the resulting read current $I_{READ}$ passed through memristor 100-2,2 onto bit line BL2. In an exemplary embodiment in which high read voltage $V_{RH}$ is 1V and lower read voltage $V_{RL}$ is 0V, a read current $I_{READ110}$ passed through read transistor 110 under these conditions is less than 1 µA when floating gate 130 is in a programmed state, and greater than 10 µA when floating gate 130 is in an erased state. Note that a read current $I_{READ120}$ passed through injection transistor 120 is typically insignificant (i.e., less than 10% of read current $I_{READ110}$). By facilitating low-voltage readout operations in this manner (and by preventing over-erase), memristor 100-2,2 significantly reduces the occurrence of sneak (leakage) currents. Moreover, by providing diodes 140 in each memristor 100-1,1 to 100-3,3 in cross-point array 200, the present invention avoids sneak currents from corrupting read current $I_{READ}$ even if an over-erase condition exists in one of memristors 100-1,1 to 100-3,3. By way of example, referring to the lower portion of FIG. 1, if memristor 100-2,3 has a low resistance that would allow a hypothetical sneak current $I_{SNEAK}$ to pass onto bit line BL3, the presence of diodes 140 in each of the memristors connected to bit line BL3 (e.g., diode 140-3,3 of memristor 100-3,3) prevents sneak current $I_{SNEAK}$ from finding its way back to bit line BL2 in the manner described above with reference to FIG. 12. That is, because diode 140-3,3 is oriented to prevent current flow from bit line BL3 to word line WL3, sneak current $I_{SNEAK}$ is prevented from passing through intermediate memristor 100-3,3, thereby preventing corruption of read signal $I_{READ}$ on bit line BL2.

Figure 6:
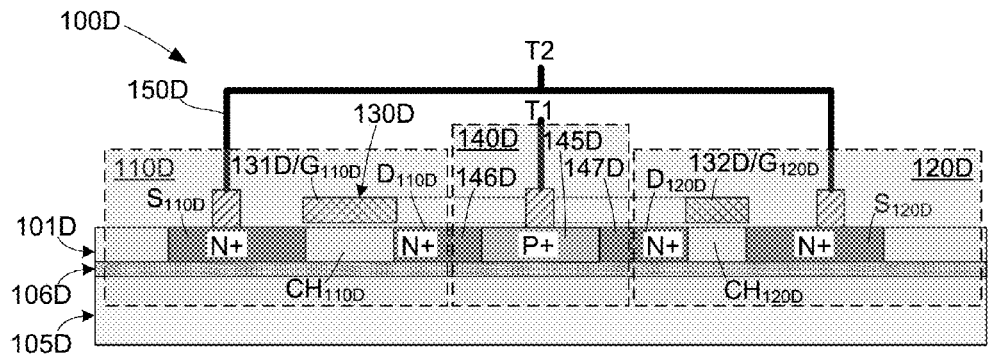
FIG. 6 is a simplified cross-sectional side view showing a memristor according to a fourth specific embodiment of the present invention.
Figure 7:
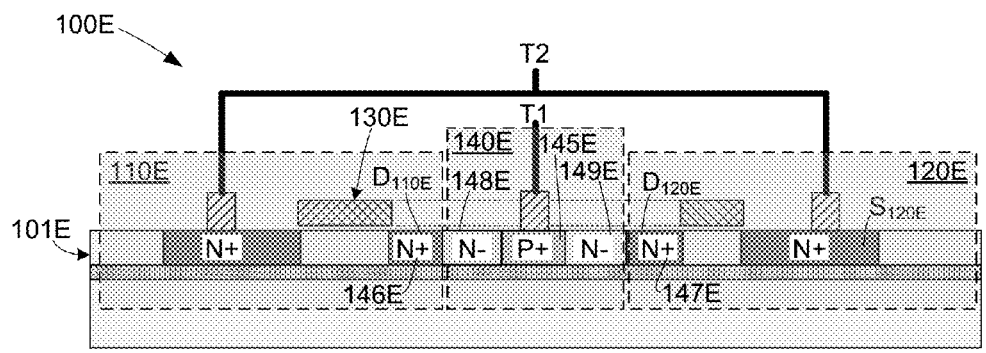
FIG. 7 is a simplified cross-sectional side view showing a memristor according to a fifth specific embodiment of the present invention.
Figure 8:
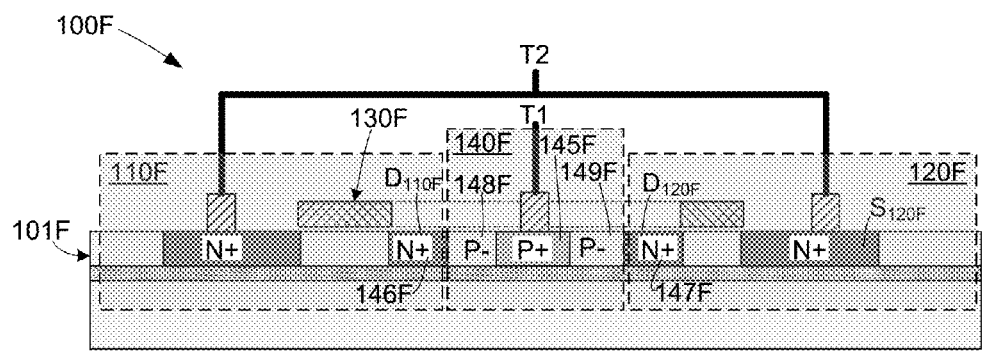
FIG. 8 is a simplified cross-sectional side view showing a memristor according to a sixth specific embodiment of the present invention.

The present invention will now be described with reference to single-poly CMOS (bulk silicon and SOI) embodiments that demonstrate the various low-cost methodologies by which memristors of the present invention may be fabricated. FIGS. 3(A) to 5 are directed to bulk silicon embodiments in which each memristor's diode is implemented either as p-n junction diodes or Schottky diodes, and FIGS. 6 to 8 are directed to SOI embodiments in which each memristor's diode is implemented, for example, as a lateral diode. The disclosed bulk silicon embodiments (FIGS. 3(A) to 5) are similar in that the drain regions (terminals) of the readout and injection transistors are implemented using relatively highly n-doped (N+) regions at least partially disposed in one or more p-doped regions of a p-type silicon substrate, and each p-n junction or Schottky diode is at least partially disposed in an N-doped well (N-well) region of the silicon substrate, where the N-well region abuts both drain terminals of the readout and injection transistors. The disclosed SOI embodiments (described below with reference to FIGS. 6 to 8) are similar in that the drain regions (terminals) of the readout and injection transistors are implemented using relatively highly n-doped (N+) regions disposed in an SOI substrate, where each memristor's diode is implemented by one or more doped regions disposed in the SOI substrate and coupled to (i.e., directly abutting or connected by way of an intervening N-doped or P-doped region formed in the SOI substrate) both drain terminals of the readout and injection transistors.

Figure 3A:
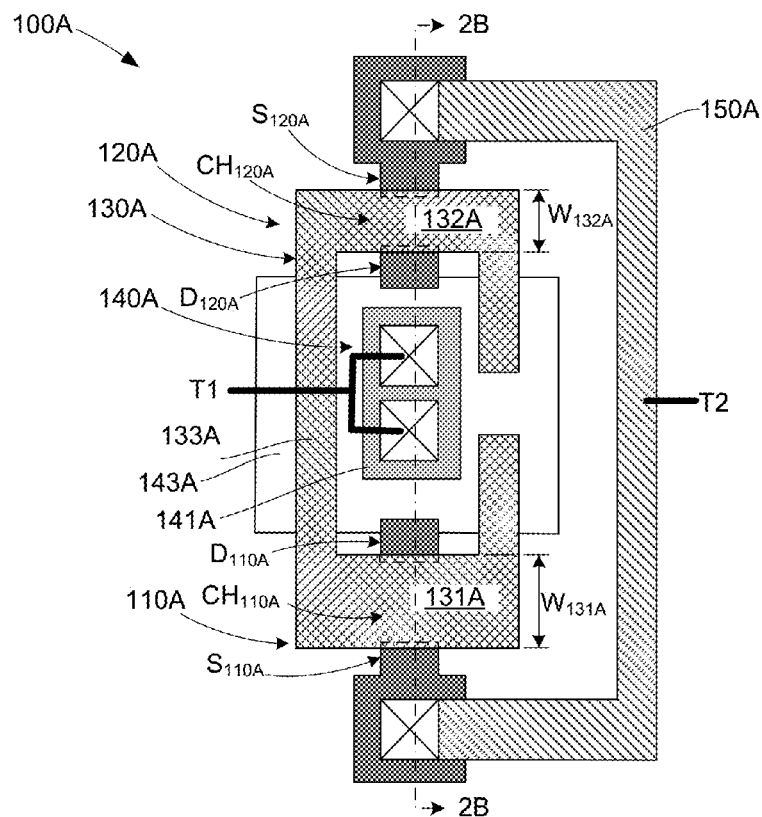
FIGS. 3(A) and 3(B) are top plan and simplified cross-sectional side view showing a memristor according to a first specific embodiment of the present invention.
Figure 3B:
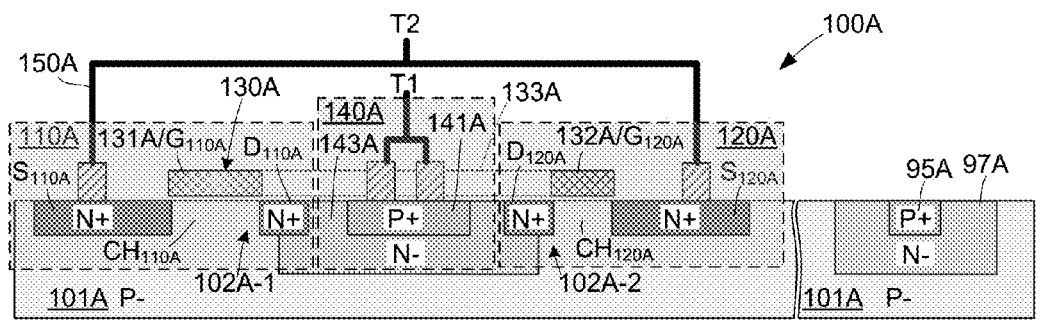

FIGS. 3(A) and 3(B) depict a memristor 100A according to a first specific embodiment of the present invention. Referring to FIG. 3(A), memristor 100A includes an NMOS readout transistor 110A, an NMOS injection transistor 120A, a shared polysilicon floating gate structure 130A, and a p-n junction diode 140A formed by a P+ diffusion region 141A disposed in an N-well region 143A. NMOS readout transistor 110A includes an N+ source region $S_{110A}$ separated from an N+ drain region $D_{110A}$ by a p-doped channel region $CH_{110A}$, which is formed by a portion of p-doped region 102A-1 of substrate 101A, and a gate terminal formed by a poly portion 131A of floating gate 130A having a width $W_{131}$, that defines the channel length of readout transistor 110A. NMOS injection transistor 120A includes an N+ source region $S_{120A}$ separated from an N+ drain region $D_{120A}$ by a channel region $CH_{120A}$, which is formed by a portion of p-doped region 102A-2 of substrate 101A, and a gate terminal formed by a poly portion 132A of floating gate 130A having a width $W_{132A}$ that defines the channel length of readout transistor 120A. The N+ regions forming drain regions $D_{110A}$ and $D_{120A}$ are partially disposed in (abut) N-well region 143A, whereby diode 140A is connected to readout transistor 110A and injection transistor 120A. In addition, the N+ regions forming drain regions $D_{110A}$ and $D_{120A}$ are partially disposed in p-doped regions 102A-1 and 102A-2, respectively, of p-substrate 101A. The N+ regions forming source regions $S_{110A}$ and $S_{120A}$ are connected together by way of a conductive structure 150A to form terminal T2. In one embodiment, conductive structure 150A is implemented by an active line (i.e., a salicided diffusion or by a metal connection that uses contacts, as shown in FIG. 3(A)). In the exemplary embodiment, floating gate 130A is a "C" shaped polysilicon structure formed on an HV oxide (not shown), includes poly portion 131A disposed over a channel region $C_{110A}$ of readout transistor 110A, a second poly portion 132A disposed over a channel region $C_{120A}$ of readout transistor 110A, and an intervening third poly portion 133A connecting poly portions 131A and 132A.

According to a practical embodiment, to minimize fabrication costs, both of P+ region 141A and N-well region 143A of p-n junction diode 140A are formed simultaneously with all other N− and P+ implants (e.g., P+ region 95A and N-well region 97A, which are utilized by another device fabricated on substrate 101A) formed on substrate 101A in order to minimize fabrication costs. That is, P+ region 141A is formed simultaneously with all other P+ regions (e.g., P+ region 95A, which is part of another device formed on substrate 101A) using the same standard CMOS P+ implant process, and N-well region 143A is formed simultaneously with all other N-well regions (e.g., N-well region 97A, in which P+ region 95A is formed) using the same standard N-type implant process. In alternative specific embodiments, one or both of P+ region 141A and N-well region 143A comprise non-standard (special) implants generated by way of additional (non-standard (special) implant processes in order to enhance operating characteristics of diode 140A. The non-standard P+ and N-well implant processes differ from the standard P+ and N-well implant processes by way of utilizing one or more of a different dopant, a different implant energy, or different implant time, tilt or twist parameters, whereby the resulting non-standard implant differs in dopant composition, doping concentration level and/or doping profile from standard implants produced by the corresponding standard implant processes. In one specific embodiment, P+ diffusion region 141A comprises a non-standard implant generated by way of a non-standard (second) P+ implant process (i.e., such that P+ diffusion region 141A differs from standard P+ region 95A), and N-well region 143A comprises a standard N-well implant generated by the standard n-type implant process (i.e., such that N-well region 143A is identical to standard N-well region 97A). In a second specific embodiment, P+ diffusion region 141A is a standard P+ implant generated using the flow's standard P+ implant (i.e., identical to P+ region 95A), and N-well region 143A is a non-standard N-well implant generated by a non-standard (special) n-type implant process (i.e., such that N-well region 143A differs from standard N-well region 97A). In a third specific practical embodiment, both P+ diffusion region 141A and N-well region 143A are implemented by respective non-standard implants (i.e., both implants differ from standard P+ implant 95A and standard N-well region 97A, respectively). The use of one or more non-standard implant processes increases manufacturing costs by way of requiring at least one additional mask and associated process steps, but these additional costs may be justified when standard implants are found to produce diodes exhibiting unsatisfactory performance.

Figure 4:
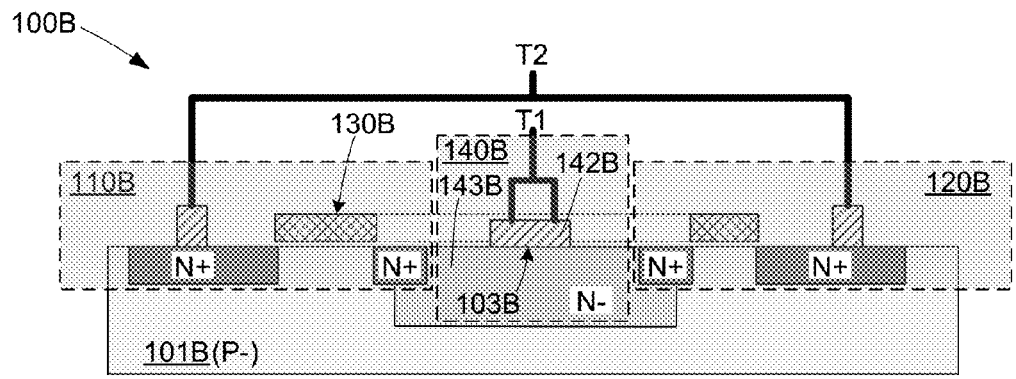
FIG. 4 is a simplified cross-sectional side view showing a memristor according to a second specific embodiment of the present invention.

FIG. 4 depicts a memristor 100B including a Schottky diode 140B formed on a bulk p-type substrate 101B according to another specific embodiment. Similar to the p-n junction approach described above with reference to FIG. 3(B), memristor 100B includes an NMOS readout transistor 110B and an NMOS injection transistor 120B that are formed by N+ source/drain regions formed in substrate 101B, and utilize a shared polysilicon floating gate structure 130B (e.g., a C-shaped structure such as floating gate 130A shown in FIG. 3(A)). In addition, Schottky diode 140B is formed in a centrally located N-well region 143B that abuts the N+ drain regions of readout transistor 110B and injection transistor 120B. Memristor 100B differs from memristor 100A (FIG. 3(A)) in that Schottky diode 140B omits the p-type diffusion used in p-n junction diode 140A (see FIG. 3(B)), and is instead formed by a metal-to-silicon interface between a metal contact structure 142B and N-well region 143B (i.e., metal contact structure 142B is formed in direct contact with upper substrate surface 103B of p-doped silicon substrate 101B, and N-well region 143B extends to the portion of upper substrate surface 103B contacted by metal contact structure 142B). The use of Schottky diode 140B provides certain advantages over p-n junction diode 140A. That is, referring to FIG. 3(B), a parasitic transistor may be formed by P+ region 141A, N-well region 143A and P− (bulk) substrate 101A that can be switched on during programming and readout by potentials generated at drain region $D_{120A}$. The Schottky approach of memristor 100B eliminates this possible parasitic transistor by eliminating all P-N-P structures in the diode region.

Figure 5:
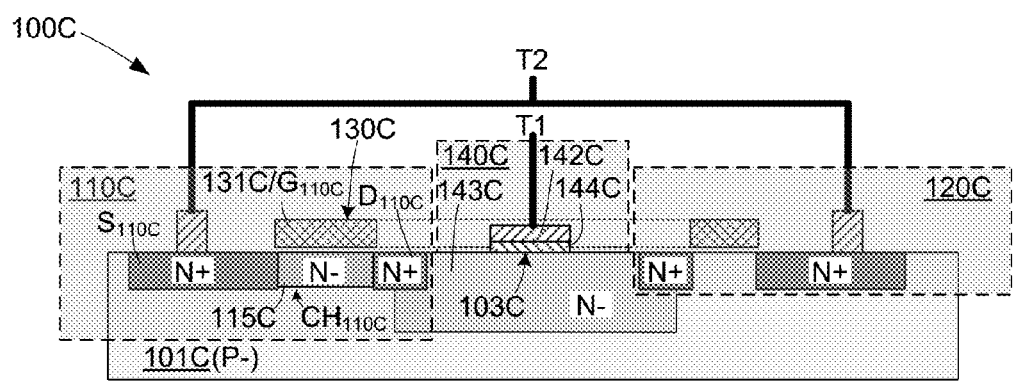
FIG. 5 is a simplified cross-sectional side view showing a memristor according to a third specific embodiment of the present invention.

FIG. 5 depicts a second memristor 100C including a Schottky diode 140C. Similar to the previously described bulk silicon embodiments, memristor 100C includes an NMOS readout transistor 110C and an NMOS injection transistor 120C that are formed by N+ source/drain regions formed in substrate 101C, and utilize a shared (e.g., C-shaped) polysilicon floating gate structure 130C. a Schottky diode 140C differs from the previous embodiment in that the Schottky diode structures is formed by a salicide structure 144C disposed between metal contact structure 142C and upper substrate surface 103C (i.e., the salicide-to-silicon interface between salicide structure 144C and N-well region 143C forms the Schottky diode structure). Schottky diode 140C may require some tuning of the salicide formation process to obtain a high quality diode.

As illustrated by FIG. 5, according to an optional alternative embodiment, memristor 100C is further modified to include a threshold voltage (Vt) implant region 115C disposed in channel region $CH_{110C}$ of readout transistor 110C, thereby causing readout transistor 110C to function as a depletion mode device. The Vt implant region 115C is formed in p-type substrate 101C, for example, using a Vt code mask (not shown) having an opening over channel region $CH_{110}$. A threshold voltage implant is then performed through the Vt code mask opening, whereby n-type impurities are implanted (e.g., phosphorous or arsenic) are implanted, for example, at an energy of about 20 keV and a dosage of about $1 \times 10^{14}$ cm$^{-3}$).

FIG. 6 shows a memristor 100D including a P+/N+ lateral diode 140D according to another specific embodiment of the present invention. As with all previous embodiments, memristor 100D includes an NMOS readout transistor 110E having N+ source region $S_{110D}$ and N+ drain region $N_{110D}$ separated by channel region $CH_{110D}$, an NMOS injection transistor 120E having an NMOS readout transistor 120E having N+ source region $S_{120D}$ and N+ drain region $N_{120D}$ separated by channel region $CH_{120D}$, and a shared (e.g., C-shaped) polysilicon floating gate structure 130D having poly portions 131D and 132D that form gate terminals $G_{110D}$ and $G_{120D}$, where source regions $S_{110D}$ and $S_{120D}$ are connected by a conductive structure 150D. Memristor 100D differs from the bulk silicon embodiments mentioned above in that readout transistor 110E, injection transistor 120E and lateral diode 140D are formed on an SOI substrate 101D, which is a thin layer of silicon separated from a carrier wafer 105E by an insulation layer 106E (e.g., $SiO_2$). In this embodiment, lateral diode 140D includes a P+ doped region 145D abutting N+ doped regions 146D and 147D that form drain terminals $D_{110D}$ and $D_{120D}$ of readout and injection transistors 110D and 120D, respectively. Similar to the Schottky diode approaches described above, forming lateral diode 140D on SOI substrate 101D avoids the generation of parasitic bipolar transistors associated with the use of p-n junction diodes by way of avoiding the need for forming the various diffusions of diode 140D and readout and injection transistors 110D and 120D in a well region.

FIG. 7 shows a memristor 100E including a P+/N−/N+ lateral diode 140E according to another specific embodiment of the present invention. Similar to memristor 100D, memristor 100E includes a readout transistor 100E, an injection transistor 120E and lateral diode 140E formed in a thin SOI substrate 101E. In this embodiment, lateral diode 140E includes N-type doped regions 148E and 149E disposed between a central P+ doped region 145E and N+ doped regions 146E and 147E that form drain terminals $D_{110E}$ and $D_{120E}$ of readout and injection transistors 110E and 120E.

FIG. 8 shows a memristor 100F including a P+/P−/N+ lateral diode 140F according to another specific embodiment of the present invention. Similar to memristors 100D and 100E, memristor 100F includes a readout transistor 100F, an injection transistor 120F and lateral diode 140F formed in a thin SOI substrate 101F. In this embodiment, lateral diode 140F includes P− doped regions 148F and 149F disposed between a central P+ doped region 145F and N+ doped regions 146F and 147F that form drain terminals $D_{110F}$ and $D_{120F}$ of readout and injection transistors 110F and 120F.

Figure 9:
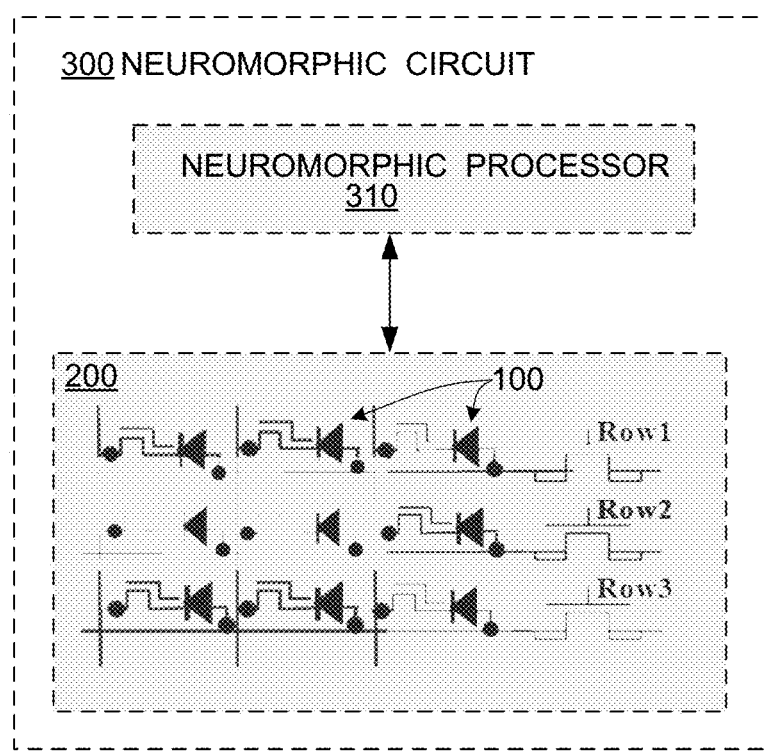
FIG. 9 is a simplified circuit diagram showing a neuromorphic circuit including the memory circuit of FIG. 1 according to another exemplary embodiment of the present invention.

FIG. 9 is a block diagram depicting a neuromorphic circuit 300 including memory circuit 200 having memristors 100 formed in accordance with any of the various embodiments described above. As set forth above, memristor 100 utilizes parallel-connected readout and injection transistors and a series-connected diode in a way that avoids over-erase and sneak current effects while facilitating low voltage readout operations, making memristors 100 suitable for cross-point arrays, which is ideal for most neuromorphic circuits and other bio-inspired devices that emulate learning functions. Moreover, the single-poly structure of memristor 100 facilitates integration of memory circuit 200 into the same standard CMOS fabrication flow utilized to generate other circuitry (e.g., a neuromorphic processor 310) of neuromorphic circuit 300, thereby minimizing production costs. Memristors 100 produced in the manner above are also believed to be highly reproducible and repeatable, to exhibit extra high retention, and to require relatively simple circuitry for performing the program, erase and readout operations described above.

Although the present invention has been described with respect to certain specific embodiments, it will be clear to those skilled in the art that the inventive features of the present invention are applicable to other embodiments as well, all of which are intended to fall within the scope of the present invention. For example, although the memristors described above are suitable for fabrication using single-poly CMOS fabrication flows, they may also be produced using more complicated multiple-poly fabrication flows that may be needed to produce other portions of a neuromorphic circuit.

The invention claimed is:

1. A memristor comprising:
a first transistor including a first source terminal and a first drain terminal;
a second transistor including a second source terminal and a second drain terminal;
an integral floating polycrystalline silicon structure including a first poly portion configured to form a first gate terminal of the first transistor and a second poly portion configured to form a second gate terminal of the second transistor; and
a diode having a cathode connected to the first and second drain terminals,
wherein the first and second transistors are connected in parallel, and
wherein the first and second transistors are asymmetrical.

2. The memristor of claim 1, wherein said integral floating polycrystalline silicon gate structure comprises the only polycrystalline silicon structure of said memristor.

3. The memristor of claim 1, wherein said diode comprises one of a p-n junction diode, a Schottky diode, and a lateral Silicon-On-Insulator (SOI) diode.

4. The memristor of claim 1,
wherein both the first drain terminal and the second drain terminal comprise N+ doped regions at least partially disposed in one or more p-doped regions of a silicon substrate, and
wherein said diode is at least partially disposed in an N-well region of the silicon substrate, said N-well region abutting both the first and second drain terminals.

5. The memristor of claim 4, wherein said diode comprises a p-n junction diode including a P+ diffusion region disposed in said N-well region.

6. The memristor of claim 5, wherein said P+ diffusion region comprises a non-standard implant and said N-well region comprises a standard implant.

7. The memristor of claim 5, wherein said P+ diffusion region comprises a standard implant and said N-well region comprises a non-standard implant.

8. The memristor of claim 5, wherein said P+ diffusion region comprises a non-standard implant and said N-well region comprises a non-standard implant.

9. The memristor of claim 4, wherein said diode comprises a Schottky diode including a metal contact structure disposed in contact with said N-well region by way of an upper surface of said silicon substrate.

10. The memristor of claim 4, wherein said diode comprises a Schottky diode including a silicide structure disposed in contact with said N-well region by way of an upper surface of said silicon substrate.

11. The memristor of claim 1,
wherein both the first drain terminal and the second drain terminal comprise N+ doped regions disposed in a silicon-on-insulator (SOI) substrate, and
wherein said diode comprises one or more doped regions disposed in said SOI substrate and coupled to both the first and second drain terminals.

12. The memristor of claim 11, wherein said diode comprises a lateral diode including a P+ doped region abutting said N+ doped regions forming said first and second drain terminals.

13. The memristor of claim 11, wherein said diode comprises a lateral diode including a P+ doped region and at least one N-type doped region disposed between said P+ doped region and said N+ doped regions forming said first and second drain terminals.

14. The memristor of claim 11, wherein said diode comprises a lateral diode including a P+ doped region and at least one P− doped region disposed between said P+ doped region and said N+ doped regions forming said first and second drain terminals.

15. A memory circuit comprising a plurality of memristors disposed in a cross-point array, each said memristor having a first terminal connected to an associated first line and a second terminal connected to an associated second line, wherein said each memristor comprises:
first and second transistors, said first transistor including a first source terminal and a first drain terminal, and said second transistor including a second source terminal and a second drain terminal, wherein the first and second source terminals of the first and second transistors are connected to said second terminal;
a diode having an anode connected to the first terminal and a cathode connected to the first and second drain terminals of the first and second transistors; and
an integral floating polycrystalline silicon gate structure including a first poly portion configured to form a first gate terminal of the first transistor and a second poly portion configured to form a second gate terminal of the second transistor,
wherein said first and second transistors are asymmetrical.

16. The memory circuit according to claim 15, further comprising a control circuit configured to apply a positive programming voltage to the associated first line of said each memristor while coupling the associated second line to ground during a program operation period, thereby generating a channel hot electron (CHE) injection mechanism that causes the injection of electrons into said floating polycrystalline silicon gate structure by way of said second poly portion), whereby the resulting programmed charge stored on floating polycrystalline silicon gate structure increases the threshold voltage of said each memristor.

17. The memory circuit according to claim 15, further comprising a control circuit configured to apply a positive erase voltage to the associated second line of said each memristor while coupling the associated first line to ground during an erase operation period, thereby generating a band-to-band tunneling mechanism that causes the injection of holes into said floating polycrystalline silicon gate structure by way of said second poly portion), whereby an erased charge stored on floating polycrystalline silicon gate structure decreases the threshold voltage of said each memristor.

18. The memory circuit according to claim 15, further comprising a control circuit configured to apply a first positive readout voltage to the associated first line of said each memristor and to apply a second positive readout voltage to the associated second line, said first readout voltage being higher than said second readout voltage, said control circuit also being configured to measure the resulting read current passed through said each memristor onto the associated second line during a readout operation period.

19. A neuromorphic circuit comprising a plurality of memristors each said memristor comprising:
- first and second asymmetrical transistors, said first transistor including a first source terminal and a first drain terminal, and said second transistor including a second source terminal and a second drain terminal, wherein the first and second source terminals of the first and second transistors are connected to a second terminal of the memristor, and
- a diode having an anode connected to a first terminal of the memristor and a cathode connected to the first and second drain terminals of the first and second transistors; and
- an integral floating polycrystalline silicon gate structure including a first poly portion configured to form a first gate terminal of the first transistor, a second poly portion configured to form a second gate terminal of the second transistor, and a third poly portion integrally connected to both of said first poly portion and said second poly portion,
- wherein said first transistor is configured such that a first drain-to-gate capacitance generated between the first poly portion and the first drain terminal is greater than a first source-to-gate capacitance generated between the first poly portion and the first source terminal, and wherein said second transistor is configured such that a second drain-to-gate capacitance generated between the second poly portion and the second drain terminal is greater than a second source-to-gate capacitance generated between the second poly portion and the second source terminal.

20. The neuromorphic circuit of claim 19, further comprising a control circuit configured to:
- apply a positive programming voltage to the first terminal of said each memristor while coupling the second terminal of said each memristor to ground during a program operation period such that electrons are injected into said floating polycrystalline silicon gate structure, and
- apply a positive erase voltage to the associated second terminal of said each memristor while coupling the first terminal of said each memristor to ground during an erase operation period such that holes are injected into said floating polycrystalline silicon gate structure.

* * * * *